US010132852B2

(12) United States Patent
Wiza et al.

(10) Patent No.: US 10,132,852 B2
(45) Date of Patent: Nov. 20, 2018

(54) METHOD AND APPARATUS FOR ACTIVE LOAD IMPEDANCE MONITORING (71) Applicant: GENERAL ELECTRIC COMPANY, Schenectady, NY (US)

(72) Inventors: Margaret Ann Wiza, New Berlin, WI (US); Louis Martin Frigo, Brookfield, WI (US); Melissa Jean Freeman, Oconomowoc, WI (US); Douglas Link, Lake Mills, WI (US); Michael Thomas Rose, Wauwatosa, WI (US); Andrew John Panos, Milwaukee, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 788 days.

(21) Appl. No.: 14/585,813

(22) Filed: Dec. 30, 2014

(65) Prior Publication Data
US 2016/0187411 A1 Jun. 30, 2016

(51) Int. Cl.
*G01R 31/06* (2006.01)
*G01R 33/385* (2006.01)
*G01R 31/44* (2006.01)

(52) U.S. Cl.
CPC ............. *G01R 31/06* (2013.01); *G01R 31/44* (2013.01); *G01R 33/3852* (2013.01)

(58) Field of Classification Search
CPC .......... H02H 1/0015; H02H 3/44; H02H 3/50; G01R 33/3852; G01R 31/14; G01R 31/025; G01R 31/1272; G01R 19/2509; G01R 31/021; G01R 31/40; H03G 2201/208; H03G 2201/103; H03F 1/52
See application file for complete search history.

(56) References Cited

U.S. PATENT DOCUMENTS

| | | | |
|---|---|---|---|
| 5,047,724 A | 9/1991 | Boksiner et al. | |
| 6,313,641 B1 * | 11/2001 | Brooks | G01R 31/025 324/424 |
| 6,452,767 B1 * | 9/2002 | Brooks | H01H 71/125 361/42 |
| 7,068,480 B2 | 6/2006 | Wong et al. | |
| 7,136,265 B2 | 11/2006 | Wong et al. | |

(Continued)

FOREIGN PATENT DOCUMENTS

WO 2007035488 A2 3/2007

OTHER PUBLICATIONS

International Search Report and Written Opinion for International Application No. PCT/US2015/066977 dated Dec. 21, 2015. 11 pages.

*Primary Examiner* — Clayton E Laballe
*Assistant Examiner* — Ruifeng Pu (57) ABSTRACT An apparatus that includes a power amplifier; a load that is operatively connected to be electrically driven from the power amplifier; and an impedance monitor that is configured to in real-time identify a favorable segment within an output waveform of the power amplifier, model the baseline power spectral density of a load driven by the power amplifier during the identified segment of the output waveform, sample an empirical power spectral density of the load during the identified segment of the output waveform, and indicate a load fault in the event that the empirical power spectral density deviates from the baseline power spectral density beyond at least one pre-determined error criteria.

15 Claims, 8 Drawing Sheets (56) References Cited

U.S. PATENT DOCUMENTS

| | | |
|---|---|---|
| 7,366,622 B1 | 4/2008 | Nemir et al. |
| 2005/0206447 A1 | 9/2005 | Yamazaki et al. |
| 2005/0207083 A1 | 9/2005 | Rivers, Jr. et al. |
| 2011/0221438 A1* | 9/2011 | Goodwill ............... G01R 33/10 324/301 |
| 2012/0249145 A1 | 10/2012 | Lai et al. |
| 2013/0285664 A1 | 10/2013 | Scheel et al. |
| 2016/0187444 A1* | 6/2016 | Frigo ................ G01R 33/3852 324/307 |
| 2017/0025996 A1* | 1/2017 | Cheung ................ G01R 31/40 |
| 2017/0131338 A1* | 5/2017 | Schaper ............... G01R 31/025 |
| 2017/0290075 A1* | 10/2017 | Carbajal ............... H04W 16/14 |
| 2018/0120393 A1* | 5/2018 | Atalar ................ G01R 33/3852 |

* cited by examiner

METHOD AND APPARATUS FOR ACTIVE LOAD IMPEDANCE MONITORING

BACKGROUND

Technical Field

Embodiments of the invention relate generally to load fault detection. Particular embodiments relate to real-time monitoring of load impedance within gradient coils of a magnetic resonance imaging (MRI) system.

Discussion of Art

Magnetic resonance imaging (MRI) systems typically utilize a gradient driver subsystem that includes gradient coil amplifiers, gradient power supply(s), and accessories that connect the gradient driver subsystem to a gradient coil. The gradient driver consists of three gradient amplifiers, one per gradient axis (X, Y, Z). The three physical axes are independent as they each generate an electrical current representing a physical prescription of a digital waveform, which is defined by a Pulse Sequence Description (PSD).

Each gradient waveform drives a corresponding gradient coil, which produces Frequency Encoding, Phase Encoding and Slice Selection magnetic field gradients that digitize or voxellate a region of interest within a scan volume of the MRI system. As such, the gradient amplifier is a bandwidth limited current source that produces arbitrary waveforms, which are utilized to correlate MRI data to particular locations within the scan volume. As will be appreciated, a loose electrical connection from a gradient amplifier to its coil, or a gradient coil that opens under load in a magnetic field, can potentially cause image quality issues or overheat and damage equipment.

Therefore, it is generally desirable to discern when a loose connection or gradient coil failure occurs, and in case one of these anomalies might occur, to timely indicate that MRI system performance is degraded.

BRIEF DESCRIPTION

Embodiments of the invention implement a method that includes identifying a favorable segment within an output waveform of a power amplifier; modeling the baseline power spectral density of a load driven by the power amplifier, during the identified segment of the output waveform; sampling an empirical power spectral density of the load during the identified segment of the output waveform; and indicating a load fault in the event that the empirical power spectral density deviates from the baseline power spectral density beyond at least one pre-determined error criteria.

Other embodiments implement a method that includes modeling three axes of gradient coil current during operation of a pulse generator module for gradient waveform production; sampling at least one gradient coil current during the gradient waveform production; deriving an empirical power spectral density for the at least one sampled gradient coil current; deriving the baseline power spectral density for one of the modeled axes that corresponds to the at least one sampled gradient coil current; and indicating a fault in the sampled gradient coil, in the event that the baseline power spectral density deviates from the empirical power spectral density beyond at least one pre-determined error criteria.

Other embodiments provide an apparatus that includes a power amplifier; a load that is operatively connected to be electrically driven from the power amplifier; and an impedance monitor that is configured to in real-time identify a favorable segment within an output waveform of the power amplifier, model the baseline power spectral density of a load driven by the power amplifier during the identified segment of the output waveform, sample an empirical power spectral density of the load during the identified segment of the output waveform, and indicate a load fault in the event that the baseline power spectral density deviates from the empirical power spectral density beyond at least one pre-determined error criteria.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to MRI systems, embodiments of the invention also are applicable to real-time monitoring for load faults, generally.

As used herein, the terms "substantially," "generally," and "about" indicate conditions within reasonably achievable manufacturing and assembly tolerances, relative to ideal desired conditions suitable for achieving the functional purpose of a component or assembly. The term "real-time" means substantially concurrent with and responsive to an ongoing process, i.e. capable of providing a feedback signal to interrupt the ongoing process in response to a monitored process variable exceeding a threshold.

Figure 1:
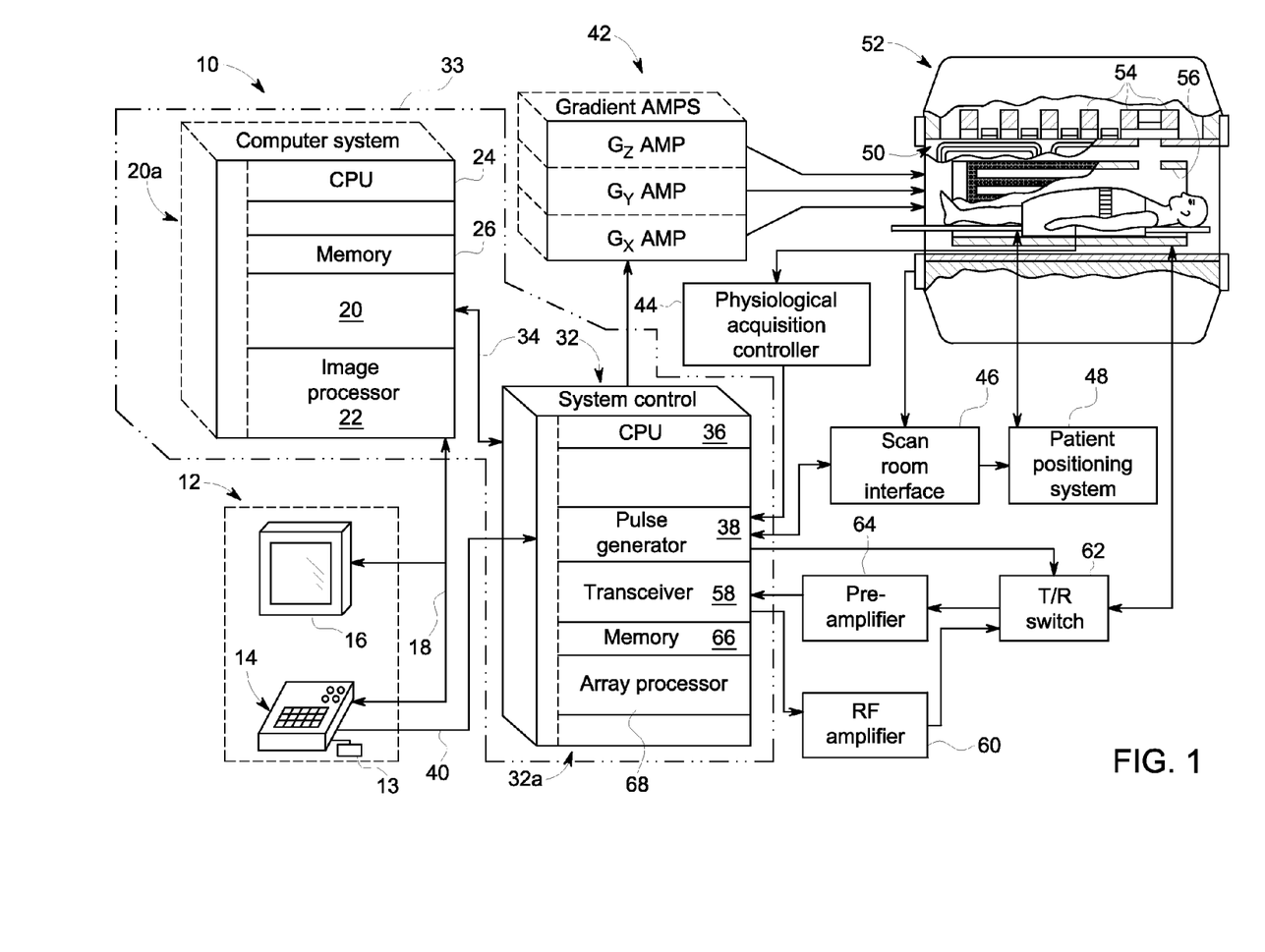
FIG. 1 shows schematically an exemplary magnetic resonance imaging (MRI) system in which embodiments of the present invention are implemented.

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 33. According to embodiments and aspects of the invention, the MRI controller 33 is configured to accomplish a method for separately imaging water, fat, and silicone, for example by implementing an exemplary algorithm that is further discussed below.

The MRI system control 32 includes a set of modules connected together by a backplane 32a. These include a CPU module 36 as well as a pulse generator module 38. The CPU module 36 connects to the operator console 12 through a serial link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 33, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil x, y, or z in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0) and a whole-body RF coil 56 (which, in operation, provides a transverse magnetic field B1 that is generally perpendicular to B0). In an embodiment of the invention, RF coil 56 is a multi-channel coil. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode.

After the multi-channel RF coil 56 picks up the RF signals produced from excitation of the target, the transceiver module 58 digitizes these signals. The MRI controller 33 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long-term storage or it may be further processed by the image processor 22 and conveyed to the operator console 12 and presented on the display 16.

As mentioned above, during operation of the MRI system 100 for an MRI scan, the pulse generator module 38 applies gradient waveforms to the gradient coil assembly 50 via the gradient amplifier system 42. The gradient waveforms drive corresponding gradient coil voltages and currents to locally adjust magnetization of a scan volume enclosed by the magnet assembly 52. In particular, the gradient waveforms provide Frequency Encoding, Phase Encoding, and Slice Selection gradients of magnetization in order to define a specific region of interest for an MRI experiment within the magnet assembly 52.

Figure 2:
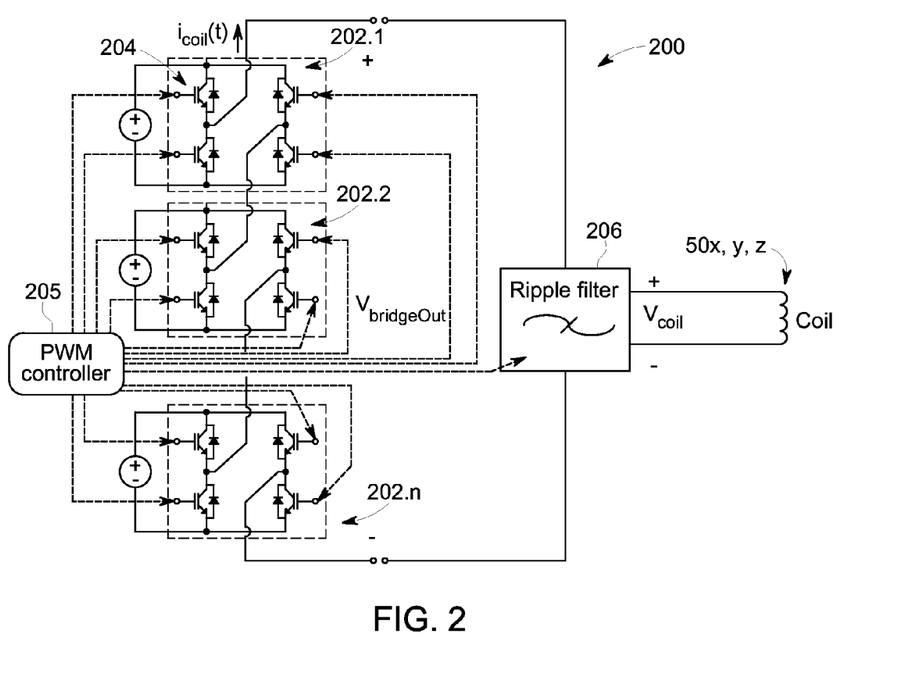
FIG. 2 shows schematically a gradient power amplifier and a ripple cancellation filter used in the exemplary MRI system of FIG. 1.

The gradient amplifier system 42 includes three gradient amplifiers, one per gradient axis (X, Y, Z). FIG. 2 shows schematically a gradient amplifier 200 that is formed as a stacked topology of plural H-bridge circuits 202.1, 202.2, . . . 202.n. The stacked H-bridges 202 are composed of IGBTs 204, which are driven by a PWM controller 205 (a component of the pulse generator module 38) according to a pulse width modulation algorithm that trades off switching and conductive losses of the IGBTs and bridge interleave schemes. Generally, pulse width modulation (PWM) is a process of turning selected IGBTs on and off, according to a programmed schedule, in order to produce a time-averaged voltage from a DC power supply to a load. The fraction of a PWM schedule for which a device is on is defined as that device's duty cycle. The frequency at which the devices are turning on and off is defined as the PWM switching frequency Fsw of the controller. Although in some schedules (e.g., when PWM is used to simulate AC) the durations of on and off pulse times may vary across a schedule, the switching frequency at which the IGBTs toggle remains constant, i.e., the IGBTs can change state only at an integral multiple of Fsw. The H-bridges 202 are stacked to achieve the required maximum output voltage and in certain embodiments their PWM schedules are interleaved to minimize output filtering requirements.

As mentioned, imaging performance of the MRI system 100 can be influenced by the repeatability and fidelity of the gradient subsystem power amplifiers 200. Therefore, in addition to interleaving PWM schedules, a ripple cancellation filter 206 is connected across the output terminals of the stacked H-bridges 202 in order to mitigate any influence of the gradient amplifier 200 on imaging performance. The gradient amplifier 200 drives its gradient coil x, y, or z via the ripple cancellation filter 206. The ripple cancellation filter 206 is configured to monitor output frequency of the pulse width modulation (PWM) controller 205, and to cancel switching noise produced from the stacked H-bridges 202 at harmonics of the PWM frequency.

Figure 3:
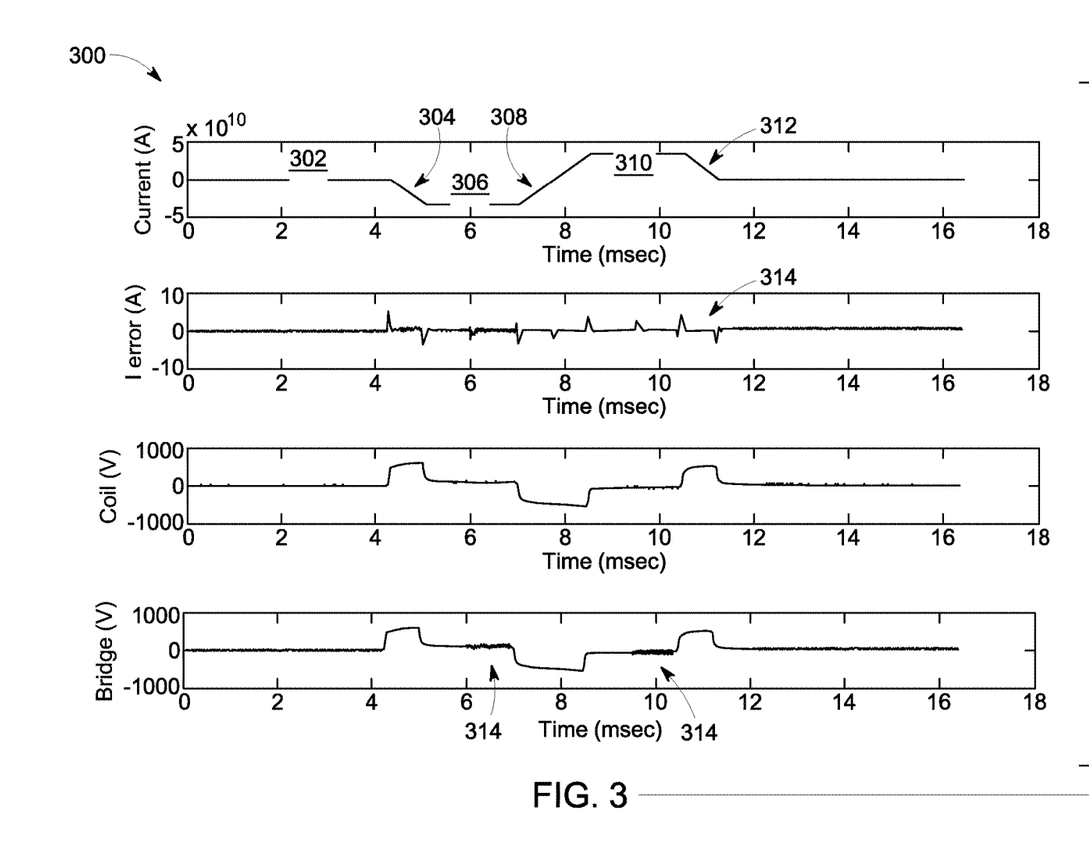
FIG. 3 shows graphically a gradient waveform produced by the gradient power amplifier of FIG. 2, during operation of the MRI system of FIG. 1.

FIG. 3 shows graphically a gradient waveform 300 that is produced by the gradient power amplifier 200 of FIG. 2, during operation of the MRI system 100 of FIG. 1. The gradient waveform 300 has several characteristic phases. These phases include zero regulation 302, negative ramp 304, negative flattop 306, positive ramp 308, positive flattop 310, and zero crossing 312. The magnitude of switching noise 314 and duty cycle vary depending on the phase of the waveform. The coil 50x, y, or z that is operatively connected to the gradient amplifier 200 is designed to respond to the gradient waveform 300 according to the voltage trace 350. However, in case of a fault in the coil 50x, y, or z, and in particular in case of a loose connection or an open (broken) coil, the voltage trace 350 will not track its expected response to the gradient waveform 300. In particular, a loose connection will cause the voltage trace 350 to respond according to the coil's higher-than-normal resistance, whereas a broken coil may cause the voltage trace 350 to respond with higher- or lower-than-normal resistance according to the nature of the failure, either an open or a short to some other coil component.

Figure 4:
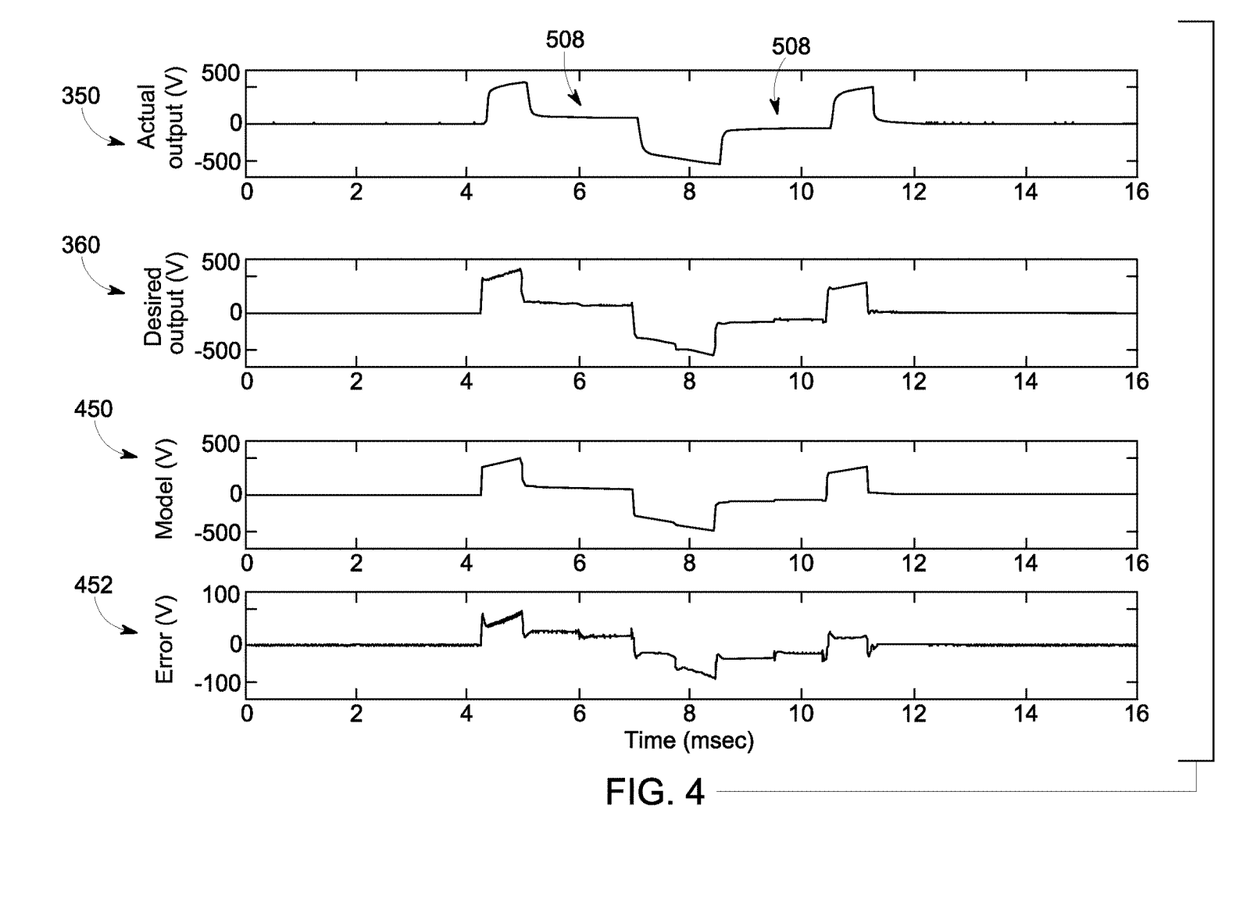
FIG. 4 shows graphically an empirical voltage trace, a desired voltage trace, a modeled voltage trace, and a voltage deviation used by a method for monitoring load impedance according to embodiments of the invention.

Thus, FIG. 4 shows graphically an empirical voltage trace 350, a desired voltage trace 360, a modeled voltage trace 450, and a voltage error 452 between the empirical voltage trace 350 and the modeled voltage trace 450.

Figure 5:
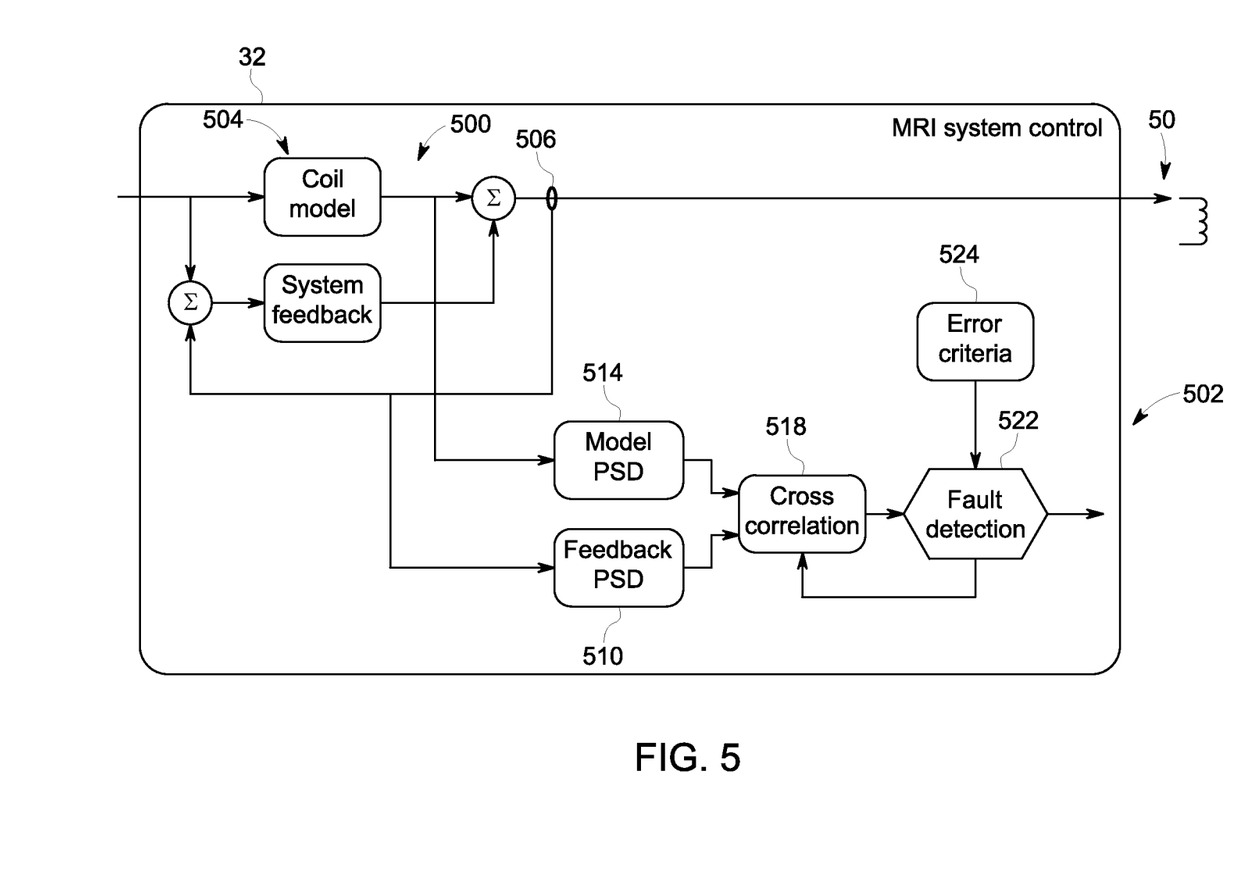
FIG. 5 shows schematically an apparatus configured to implement a method for monitoring impedance of a load driven by a power amplifier, in order to actively detect a load fault, according to embodiments of the invention.

FIG. 5 shows a method 500, which can be implemented in a power amplifier controller (e.g., the MRI system control 32 as shown in FIG. 1), for monitoring impedance of a gradient coil 50 (or any other load driven by a power amplifier) in order to actively detect a load fault 502. The method 500 includes modeling 504 coil voltages for three axes X, Y, and Z of the gradient coil 50 during operation of the pulse generator module 38 for gradient waveform production. The method 500 also includes real-time sampling 506 of empirical gradient coil current (analogue to gradient coil waveform) during the gradient waveform production; deriving 510 an empirical power spectral density for the empirical load current; deriving 514 a baseline or model power spectral density 516 for the one of the modeled axes X, Y, or Z that corresponds to the at least one sampled gradient coil current; cross correlating 518 the baseline power spectral density with the empirical power spectral density; and detecting 522 the fault 502 in the sampled gradient coil 50x, y, or z, in the event that the baseline power spectral density deviates from the empirical power spectral density beyond at least one pre-determined error criteria 524.

Figure 6:
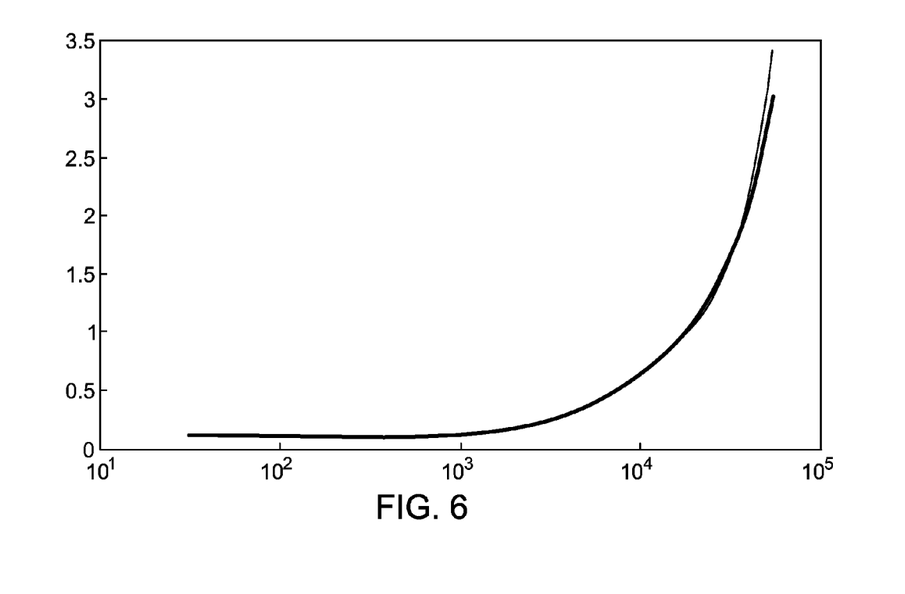
FIGS. 6-7 show graphically the frequency responses of resistance and inductance components of impedance modeled according to an embodiment of the invention.
Figure 7:
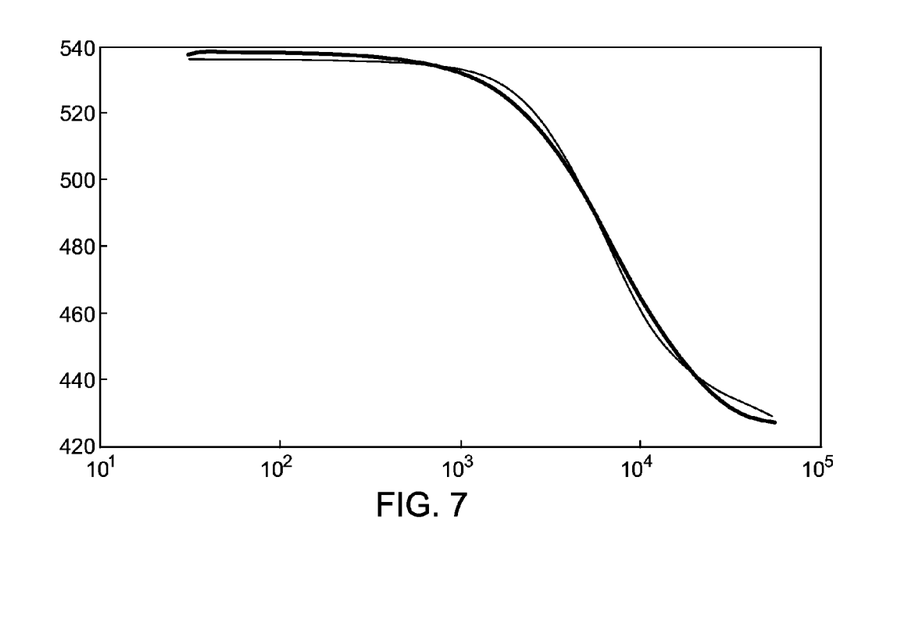
Figure 8A:
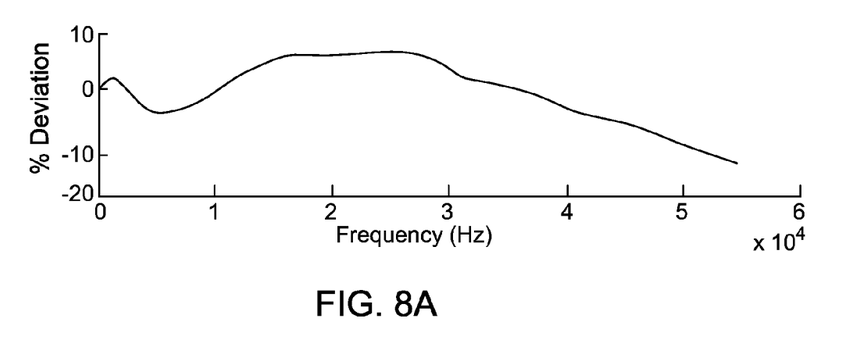
FIGS. 8A-D show graphically expected deviations of a model from empirical values.
Figure 8B:
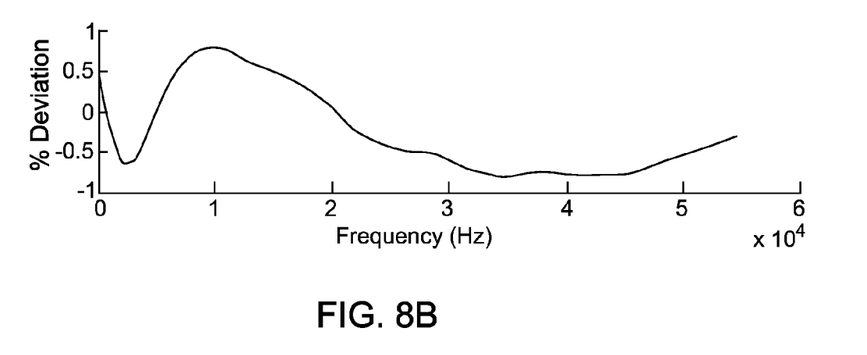
Figure 8C:
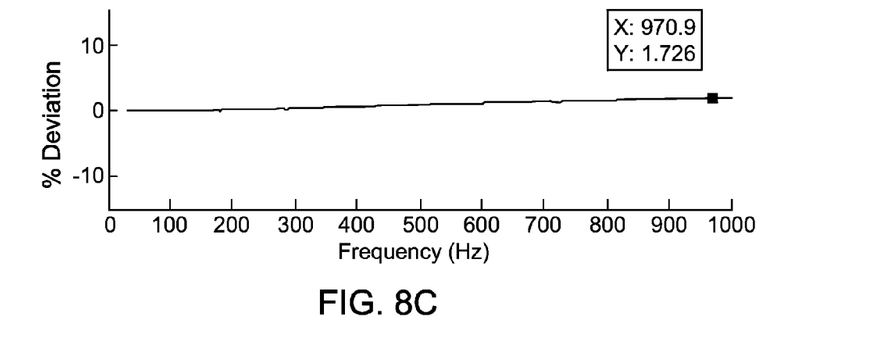
Figure 8D:
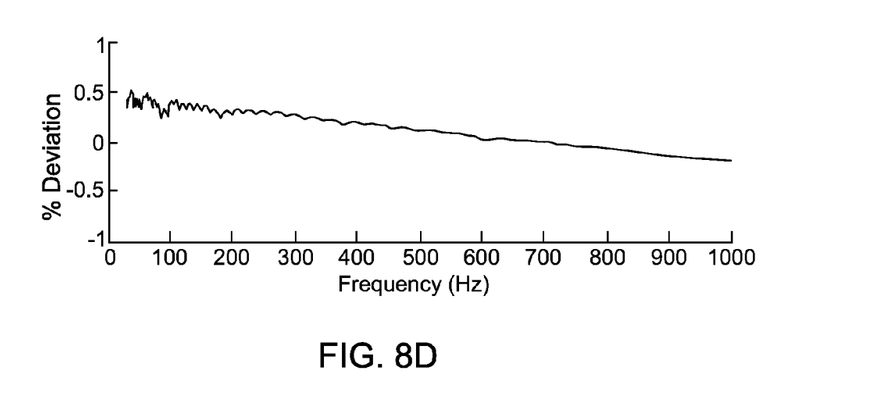

In certain embodiments the method 500 may be implemented in real-time, for example within the MRI system control 32 as shown in FIG. 5, so as to provide the immediate indication 522 of a load fault 502. In such implementations, processing efficiency can be enhanced by a simplistic impedance model, e.g., V=L*di/dt+I*R. This is particularly helpful for real-time modeling of interactions among three axes of a gradient coil power amplifier. Accordingly the modeling 504 may be limited to a favorable segment within the gradient waveform 300 that is produced by the gradient coil amplifier 200 that is connected with the sampled gradient coil 50x, y, or z. A "favorable segment" may be one in which the simplistic impedance model should be expected to deviate from empirical impedance values by less than about 2%, e.g., $[E_{Model}=100*(Z_{empirical}-Z_{model})/Z_{model}]<2.0$ for any sample throughout the favorable segment of the gradient waveform 300. For example, FIGS. 6-7 respectively show graphically the frequency responses of resistance and inductance components of impedance modeled according to V=L*di/dt+I*R. FIGS. 8A-D show that, for an exemplary load (a gradient coil 50), modeled and empirical electrical parameters may deviate by up to about 1% across a frequency band from 0-50 kHz, but by less than 0.5% across a frequency band from 0-1 kHz. Thus, a favorable waveform segment for the exemplary load may comprise a segment in which dominant frequency is less than 1 kHz.

Furthermore, high-amplitude voltage at a low frequency over a relatively long duration will exaggerate mechanical defects of a coil load (e.g., a gradient coil 50) by increasing magnetic field and coil temperature. Thus, in certain embodiments, a favorable segment will include less than one wavelength of non-zero amplitude, may have a duration greater than 1 msec, and may have relatively high-amplitude voltage (i.e. greater than about 100 V). These factors enable simplified implementation of the method 500 in order to expose mechanical defects. Thus, the definition of a favorable segment will depend upon designed electrical parameters of the gradient coil 50x, y, or z and also upon sampling frequency Fs. Typically, a favorable segment will be at least 1 msec duration of at least about 100 V at less than 1 kHz dominant frequency. Referring back to FIGS. 3 and 4, favorable segments 508 are shown at the gradient waveform 300 and at the corresponding empirical voltage trace 350 and modeled voltage trace 450. In particular, the negative flattop 306 (from about 5-7 msec at about −700 A gradient coil current) and the positive flattop 310 (from about 9-11 msec at about +700 A gradient coil current) are marked as favorable segments 508, which correspond to positive and negative flattops of gradient coil voltage at about +/−100V. During these favorable segments 508, a shorted coil would be indicated by a lower than expected voltage.

Thus, the modeling 504 can be accomplished in real-time using the output of the PWM 205 to proactively identify favorable segments 508 of the gradient waveform 300. Also based on the output of the PWM 205, sampling 506 may be accomplished in real-time during favorable segments 508 of the gradient waveform 300. Because the impedance model 504 well correlates to empirical resistance values 506 during favorable segments 508, focusing on such segments can restrict system bandwidth and enable simple (rapid) methods for detecting any mismatch between modeled and empirical values.

In certain embodiments, the error criteria may include a limit for a relative amplitude of the deviation between the expected and empirical power spectral densities within a bandwidth of interest. For example it has been mentioned that in the frequency band of 0-1 kHz, empirical and expected impedance values at each sample should match within about 0.5% relative amplitude, i.e., $[E_{Model}=100*(Z_{empirical}-Z_{model})/Z_{model}]<0.5$. Therefore a limit of 0.5% could be used as one of the error criteria. Other useful error criteria could include a value of a power integral of the deviation between the expected and empirical power spectral densities, or a frequency shift between a peak of the baseline power spectral density and a peak of the empirical power spectral density.

Thus, embodiments of the invention implement a method that includes identifying a favorable segment within an output waveform of a power amplifier; modeling the baseline power spectral density of a load driven by the power amplifier, during the identified segment of the output waveform; sampling an empirical power spectral density of the load during the identified segment of the output waveform; and indicating a load fault in the event that the baseline power spectral density deviates from the empirical power spectral density beyond at least one pre-determined error criteria. The favorable segment is of deterministic length. The favorable segment is of low-frequency spectral content and non-zero amplitude. The error criteria include a relative amplitude of the deviation between the expected and empirical power spectral densities within a bandwidth of interest. The error criteria include a value of a power integral of the deviation between the expected and empirical power spectral densities. The error criteria include a frequency shift between a peak of the baseline power spectral density and a peak of the empirical power spectral density.

Other embodiments implement a method that includes modeling three axes of gradient coil current during operation of a pulse generator module for gradient waveform production; sampling at least one gradient coil current during the gradient waveform production; deriving an empirical power spectral density for the at least one sampled gradient coil current; deriving the baseline power spectral density for one of the modeled axes that corresponds to the at least one sampled gradient coil current; and indicating a fault in the sampled gradient coil, in the event that the baseline power spectral density deviates from the empirical power spectral density beyond at least one pre-determined error criteria. The modeling and sampling may be limited to a favorable segment within an output waveform of a gradient coil amplifier connected with the sampled gradient coil. The favorable segment may comprise less than one half wavelength duration of non-zero amplitude. The favorable segment may be of low-frequency spectral content and non-zero amplitude. The error criteria may include a relative amplitude of the deviation between the expected and empirical power spectral densities within a bandwidth of interest, a value of a power integral of the deviation between the expected and empirical power spectral densities, and/or a frequency shift between a peak of the baseline power spectral density and a peak of the empirical power spectral density. The method may be accomplished in real-time.

Other embodiments provide an apparatus that includes a power amplifier; a load that is operatively connected to be electrically driven from the power amplifier; and an impedance monitor that is configured to in real-time identify a favorable segment within an output waveform of the power amplifier, model the baseline power spectral density of a load driven by the power amplifier during the identified segment of the output waveform, sample an empirical power spectral density of the load during the identified segment of the output waveform, and indicate a load fault in the event that the baseline power spectral density deviates from the empirical power spectral density beyond at least one pre-determined error criteria. The power amplifier may be a gradient coil amplifier, the load may be a gradient coil, and the real-time modeling may account three axes of gradient coil current. The modeling and sampling may be limited to a favorable segment within an output waveform of the gradient coil amplifier. The favorable segment may be of low-frequency spectral content and non-zero amplitude. The error criteria may include a relative amplitude of the deviation between the expected and empirical power spectral densities within a bandwidth of interest, a value of a power integral of the deviation between the expected and empirical power spectral densities, and/or a frequency shift between a peak of the baseline power spectral density and a peak of the empirical power spectral density.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method for monitoring the load impedance of a gradient coil in a magnetic resonance imaging (MRI) system in order to detect a fault in the gradient coil, the method comprising:
    modeling gradient coil current of the gradient coil during operation of a pulse generator module for gradient waveform production;
    sampling in real-time an empirical gradient coil current during the gradient waveform production;
    deriving an empirical power spectral density for the sampled empirical gradient coil current;
    deriving a model power spectral density for the modeled gradient coil current that corresponds to the sampled empirical gradient coil current;
    cross correlating the model power spectral density with the empirical power spectral density; and
    indicating a fault in the gradient coil, in the event that the model power spectral density deviates from the empirical power spectral density beyond at least one predetermined error criteria.

2. The method of claim 1, wherein the modeling and sampling are limited to a favorable segment within an output waveform of a gradient coil amplifier connected with the sampled gradient coil.

3. The method of claim 2, wherein the favorable segment comprises less than one half wavelength duration of non-zero amplitude.

4. The method of claim 2, wherein the favorable segment is of low-frequency spectral content and non-zero amplitude.

5. The method of claim 2, wherein the error criteria includes a relative amplitude of the deviation between the expected and empirical power spectral densities within a bandwidth of interest.

6. The method of claim 2, wherein the error criteria includes a value of a power integral of the deviation between the expected and empirical power spectral densities.

7. The method of claim 2, wherein the error criteria includes a frequency shift between a peak of the baseline power spectral density and a peak of the empirical power spectral density.

8. The method of claim 2, wherein the method is accomplished in real-time.

9. An apparatus comprising:
    a power amplifier for a gradient coil of a magnetic resonance imaging (MRI) system;
    a gradient coil load that is operatively connected to be electrically driven from the power amplifier; and
    an impedance monitor that is configured in real-time to monitor the impedance of the gradient coil load;
    wherein the impedance monitor is configured to:
    model gradient coil current of the gradient coil during operation of a pulse generator module for gradient waveform production;
    sample in real-time an empirical gradient coil current during the gradient waveform production;
    derive an empirical power spectral density for the sampled empirical gradient coil current;
    derive a model power spectral density for the modeled gradient coil current that corresponds to the sampled empirical gradient coil current;
    cross correlating the model power spectral density with the empirical power spectral density; and
    indicate a fault in the gradient coil, in the event that the model power spectral density deviates from the empirical power spectral density beyond at least one predetermined error criteria.

10. The apparatus of claim 9, wherein the power amplifier is a gradient coil amplifier, the load is a gradient coil, and the real-time modeling is of gradient coil current.

11. The apparatus of claim 10, wherein the modeling and sampling are limited to a favorable segment within an output waveform of the gradient coil amplifier.

12. The apparatus of claim 10, wherein the favorable segment is of low-frequency spectral content and non-zero amplitude.

13. The apparatus of claim 9, wherein the error criteria includes a relative amplitude of the deviation between the expected and empirical power spectral densities within a bandwidth of interest.

14. The apparatus of claim 9, wherein the error criteria includes a value of a power integral of the deviation between the expected and empirical power spectral densities.

15. The apparatus of claim 9, wherein the error criteria includes a frequency shift between a peak of the baseline power spectral density and a peak of the empirical power spectral density.

* * * * *